US006075216A

United States Patent [19]
Nakamura et al.

[11] Patent Number: 6,075,216
[45] Date of Patent: Jun. 13, 2000

[54] DEVICE TRANSFER AND REINSPECTION METHOD FOR IC HANDLER

[75] Inventors: Hiroto Nakamura, Kazo; Yoshihito Kobayashi, Gyoda; Katsuhiko Suzuki, Meiwa-mura, all of Japan

[73] Assignee: Advantest Corp., Tokyo, Japan

[21] Appl. No.: 08/888,745

[22] Filed: Jul. 7, 1997

Related U.S. Application Data

[63] Continuation of application No. 08/497,223, Jun. 30, 1997.

[30] Foreign Application Priority Data

Mar. 23, 1995 [JP] Japan .................................. 7-090376
Jun. 30, 1996 [JP] Japan .................................. 6-171911

[51] Int. Cl.⁷ ................................................. B07C 5/344
[52] U.S. Cl. ............................................ 209/573; 414/222
[58] Field of Search .................................... 209/573, 571, 209/556; 414/222, 224, 404

[56] References Cited

U.S. PATENT DOCUMENTS 5,261,775  11/1993  Kobayashi ........................... 209/573 X
5,307,011   4/1994  Tani .................................... 209/573 X Primary Examiner—David H. Bollinger
Attorney, Agent, or Firm—Muramatsu & Associates

[57] ABSTRACT

An IC device transfer method for IC handler accommodates both a tray and a rod-shaped magazine. The tray installs a plurality of IC devices which transport in horizontal directions in the IC handler. The rod-shaped magazine installs a plurality of IC devices which transport in vertical directions in the IC handler. A device reinspection method in the IC test handler reinspects the IC devices stored in the tray or magazine without human intervention, sorts in accordance with the test results, and stores in either the rod-shaped magazine or the tray. For this purpose, a tray supply section transfers a user tray to a test tray, whereas a magazine supply section and a pick carrier section transfer a rod-shaped magazine to the test tray. An inspection setting sets the number of reinspection, the classification of inspection results, and the storage tray/magazine. The IC devices are loaded from the magazine and the user tray to the test tray and are tested. When a reinspection mode is effective, the IC devices to be reinspected are stored in the unloader section and transferred to the loader section by the tray transfer system to test the IC devices again. When the reinspection mode is completed, the IC device are sorted by categories and stored in the tray/magazine.

6 Claims, 8 Drawing Sheets

DEVICE TRANSFER AND REINSPECTION METHOD FOR IC HANDLER

This is a continuation of U.S. patent application Ser. No. 08/497,223 filed Jun. 30, 1997, titled "Device Transfer Apparatus and Device Reinspection Method for IC Handler."

FIELD OF THE INVENTION

The present invention relates to an IC transfer apparatus for use with a tray type container and a rod-shaped container (magazine) used as IC storage containers for an IC handler.

In addition, this invention relates to a device reinspection method in an IC test handler that supplies devices from a magazine, reinspects devices judged as defective, and sorts and stores the retested devices in the magazine or customer tray.

BACKGROUND OF THE INVENTION

Typically, two kinds of IC storage magazines are used for an IC test handler, i.e. a tray type magazine and rod-shaped magazine. IC handler systems have been designed specifically for either one of the two types of storage magazines.

Examples of an IC transfer apparatus with the tray type magazine and rod-shaped magazine of the prior art are explained with reference to FIGS. 3 and 4.

First, the transfer section of an IC transfer system using the tray type magazine includes a user tray 170, a tray supply section 172, a supply tray 172, a supply tray transfer mechanism 174, a tray conversion section 173, a tray conversion transfer mechanism 175, a test tray 180, a test section 182, a sorting buffer stand 184, a storage tray transfer mechanism 186, and a tray storage section 189. The above-mentioned components for the transfer section are briefly described below.

The user tray 170 is a disc-shaped container and has an array of many depressed pockets for storing devices in the lateral and longitudinal directions. The devices are stored in these pockets. Multiple user trays 170 are stored in many layers in the tray supply section 172.

The supply tray transfer mechanism 174 lifts the user tray 170 from the upper most stage of the many layered user trays 170 using at transfer arm. The transfer mechanism then transfers the tray 170 and places the user tray 170 on the tray conversion section 173.

The tray conversion transfer mechanism 175 transfers the device from the user tray 170 placed on the tray conversion section 173 to the test tray 180. Typically, the transfer mechanism 175 lifts, by suction, one or more of the IC devices and transfers to the IC devices to the test tray 180 using the suction section 175a. Thereafter, the IC device is placed at a predetermined test spot on the test tray 180. Performing this step multiple times completes the transfer of all of the IC devices.

The test tray 180 that stores the devices is transferred to the test section 182 where the device is heated/cooled to the preset temperatures, then electrical tests are conducted and the device stored in the test tray 180 is ejected to the sorting buffer stand 184.

The storage tray transfer mechanism 186 lifts the device on the test tray 180 (which is located in the sorting buffer stand 184) with a suction section 186a, and transfers the device over to the position of the user tray 170. Within the user tray 170, the IC devices are sorted into groups determined by the test results. The device is thereby stored in the tray 170.

The tray storage section 189 arranges multiple user trays 170 according to the test result criterion, and stores the IC devices deposited by the storage transfer mechanism 186. Repeating the above mentioned operation executes the supply and sorting/storage of all of the IC devices within the user tray 170.

Second, the transfer section of an IC transfer apparatus having a rod type storage magazine is illustrated in FIG. 4. As shown in FIG. 4, the IC transfer apparatus includes a magazine 150, a magazine supply section 152, a supply magazine transfer mechanism 154, a test section 156, a storage magazine transfer mechanism 158, and a magazine storage section 160. The type of IC handler depicted in FIG. 4 is a selfweight fall system which relies on gravity to slide and drop the IC device during the transfer stages. The following description is a summary of the transfer operation.

The magazine 150 is a rod-shaped container that stores ICs in one row and adopts different configurations depending on the size and shape (DIP, ZIP, SOP) of the ICs. A plurality of the magazines 150 are stored in the magazine supply section 152.

The supply magazine transfer mechanism 154 tilts a magazine 150a by supporting one end of a magazine 150 from the magazine supply section 152, and lifting the other end of the magazine 150 to rotate the magazine 150. The IC devices are separated one by one by their own weight due to the inclined angle from an I rail section 155a and stored in an ER rail 155b.

The ER rail 155b is arranged in a row so as to store multiple IC devices, and the ER rail 155b stores the IC devices one by one from the previously mentioned I rail 155a by moving the ER rail 155b laterally. Thereafter, the ER rail 155b is moved laterally and positioned so as to match with a S rail 155c in multiple rows. The IC devices slide into to the S rail 155c.

The S rail 155c moves the IC devices on the S rail 155c one by one by sliding, and supplies the IC devices to the test section 156 side. In addition, the S rail 155c functions as a buffer for heating/cooling the devices to a constant temperature if desired.

The test section 156 receives the devices from the S rail 155c and performs electrical tests such as fault/no fault inspections and characteristic measurements, etc. by electrical contact with the devices. Thereafter, the IC devices are ejected to the store magazine transfer mechanism 158 side.

The storage magazine transfer mechanism 158 receives the devices from the test section 156, and sorts them by the inspection results of the fault/no fault and characteristics tests. Thus, the IC devices are stored in the magazine 150b based upon test result classifications of the storage magazines 150n which are arranged in multiple rows. For this operation, a sorter 159 receives the devices and moves laterally to the corresponding magazine 150n arranged in a row. The IC devices are deposited in the appropriate magazine by sliding into the storage magazines 150b which are inclined.

The magazine storage section 160 holds the magazines 150n which are arranged in multiple rows and stores the IC devices by sorting corresponding to the previously mentioned inspection results. Repeating the above mentioned operation accomplishes the supply and sorting/storage of IC devices by the magazine 150.

As explained thus far, in the case of the tray type magazine, the structure of these devices is such that ICs are transferred horizontally by holding and releasing the ICs by suction. On the contrary, in the case of the rod-shaped magazine, the structure of the transfer apparatus is such that IC devices are dropped by their own weight by tilting the magazine. Therefore, both the IC transfer mechanisms differ significantly. This makes it difficult for an IC handler to provide the appropriate transfer operations in conjunction with both kinds of magazine configurations.

Recently, there has been an increase in the number of device types and configurations tested by the IC handler. For example, there are devices having identical logic but different configurations; or an IC handler might need to flexibly adapt container configurations on the supply side and the storage side; furthermore, it may be desirable to transport the ICs with either the rod-shaped magazine or tray type magazine.

However, as mentioned above, it would not be desirable to have an IC handler with a fixed one magazine configuration because this would limit the kinds of IC supply and storage containers which could be used in conjunction with the IC handler. In addition, such an IC handler with a fixed one magazine configuration is impractical since its configuration poses practical limitations in utilizing the IC handler.

Furthermore, generally speaking, in testing semiconductor ICs, a handler together with the IC tester transfers and handles a tray where an IC to be measured (called a device under test, or "DUT") is placed. The handler also loads, tests, and finally, sorts by the classifications based on the test results and unloads.

The following briefly explains an exemplary transfer path of a magazine loader section 242, the test tray 180, and a DUT 215, as well as the testing method in a handler 221 having a temperature chamber 235. As shown in FIG. 6, the DUT 215 that is stored in the magazine in the magazine loader section 242 inside the handler 221 is transferred and replaced on another test tray 180 that can withstand high/low temperatures through a precision carrier 240. After the test tray 180 is transferred and circulated along a preset path, the DUT 215 is tested in a test area 237. That is, the electrical characteristics of the DUT 215 are measured under a constant temperature in the test area 237 after it is brought inside the constant temperature chamber 235, heated or cooled in a soak chamber 236 and reaches a constant temperature. Thereafter, the DUT is returned to the external temperature in a EXIT chamber 238.

The DUT 215 that is tested at low/high temperatures and returned to the external temperature in the EXIT chamber 238 is sent to an unloader section 223 while remaining on the test tray 180. The DUT 215 is then moved from the test tray 180 to a customer tray 216 or moved from the test tray 180 to a magazine unloader section 243 through a sorting carrier 241 and sorted by classifications based on the test results and transferred/stored. A suction transfer means using a vacuum pump is arranged for transferring the DUT 215 between the test tray 180 and customer tray 216, and one or more of the DUT 215 are sucked, held and transferred to another tray, and the transfer from one place to another is completed by releasing the DUT 215.

A further example of transferring the customer tray 216 from one tray storage section 225 to another tray storage section 225 is explained with reference to FIG. 7. The loader section 222, unloader section 223 and empty tray storage section 224 have multiple lanes, for example 10 lanes, which are composed of the tray storage section 225 and an elevator 226 that moves the customer tray 216 stored in the tray storage section 225 up to a level of position C as indicated by 1. In the tray storage section 225 of the loader section 222, the customer trays 216 where the DUT 215 is placed, are stacked together. All the lanes are identical and there is no distinction among the loader lanes, unloader lanes, and empty tray storage lanes. Thus, the multiple lanes (e.g., 10 lanes) are arranged in a simple layout. These lanes are designated as the loader lanes, unloader lanes, or empty tray storage lanes as required.

For example, as shown in FIG. 7, lane 1 is designed as the loader section 222 that loads the DUT 215 to be tested, lanes 2 through 9 are designated as the unloader section 223 that stores the DUT 215, (i.e., those which are already tested), by categories based on the test results. Lane 10 is designated as the empty tray storage section 224 that stores the customer trays 216 that are finished loading. The number of lanes designated to each function changes in accordance with the particular system requirements. A tray transfer system 227 transfers the customer tray 216 by hooking the tray 216 using hooks 228. Mating holes 229 on the customer tray 216 are arranged to engage with the hooks 228 of the tray transfer system 227.

FIG. 8 illustrates the process by which the tray transfer system 227 separates and transfers the upper most tray from the multiple layered customer trays 216 inside the tray storage section 225. The tray transfer system 227 is driven to a level of position C or position B by a drive mechanism as shown in FIG. 7. The transfer system 227 is driven horizontally at the level of position B over the lanes 1 through 10 arranged horizontally as indicated by 3. A tray set 230 which receives and handles the transferred DUT 215 between the customer tray 216 and test tray 180. The tray set 230 is driven to the level of position C or position A by the drive system as indicated by 4.

Here, the process by which the DUT 215 to be tested is transferred and placed onto the test tray 180 is explained below with reference to FIG. 7.

(1) raise the upper most customer tray 216 to position C by pushing the layered customer trays 216 on the tray storage section 225 in the lane 1 using the elevator 226.

(2) position the tray transfer system 227 directly above the lane 1 by horizontally driving at the level of position B.

(3) move the tray transfer system 227 down to the level of position C.

(4) hook the upper most customer tray 216 in the lane 1 by controlling the hook 226 of the tray transfer system 227.

(5) raise the tray transfer system 227 that hooked the upper most customer tray 216 from position C to position B.

(6) move the tray transfer system 227 that hooked the customer tray 216 raised to the level of position B to the lane 3 at the level of position B.

(7) fix the tray set 230 at the level of position C in the loader section 222.

(8) move the tray transfer system 227 positioned at position B in the lane 3 to the upper section of the loader 222.

(9) release and hand over the hooked customer tray 216 over the tray set 230 of the loader section 222 by controlling the hooks 228 of the tray transfer system 227.

(10) move the tray transfer system 227 that released the hooked customer tray 216 to the lane 3 by driving horizontally.

(11) raise the tray set 230 of the loader section 222 which received the customer tray 216 from the level of position C to the level of position A, and complete the setup of the customer tray 216 to the tray set 230 in the loader section 222.

Next, the DUT 215 placed on the customer tray 216 is transferred and placed on the test tray 180 inside the handler 221 (which can withstand high/low temperatures) by a suction transfer device using a vacuum pump. The test tray 180 where the DUT 215 is placed, is moved into the temperature chamber 235 and the tests are conducted.

The test tray 180 where the tested DUT 215 is placed, is moved out from the temperature chamber 235 to the unloader section 223. In the unloader section 223, in accordance with the procedure of transferring from the previously mentioned customer tray 216 to the test tray 180, the test tray 180 is transferred and placed on the customer tray 216. At this juncture, the DUT 215 is sorted into 2 to 8 categories based on the test results of the DUT 215. These classifications can be set arbitrarily based on the test objectives of each IC manufacturer.

If an IC manufacturer only wishes to test for a defect or no defect, then only two classifications are necessary. However, most IC manufacturers want the ICs to be tested for multiple characteristics so that the ICs are typically classified into more than 4 categories. For example, for the performance specification of the DUT 215, products with the best test data are classified with category 0, and good products are placed in category 1, products barely satisfying the specification are placed in category 2, and defects are placed in category 3. The categories 0 and 1 are considered good products unconditionally whereas the categories 2 and 3 are considered either a defect or a device which needs reinspection. In the case where 8 categories or classifications are used, the performance specification is divided into 8 categories. Hence, the sorting process takes longer time.

The transfer of the DUT 215 from the magazine of the magazine loader section 242 to the test tray 180 is explained with reference to FIG. 6. The DUT 215 are stored in series inside the magazine, and they are loaded into the precision carrier 240 a few pieces at a time by tilting the magazine and letting them fall by their own weight. The precision carrier 240 can be moved horizontally and moved proximate to the test tray 180. The DUT 215 loaded into the precision carrier 240 is transferred to the test tray 180 by a suction transfer device using a vacuum pump.

In addition, the transfer of the DUT 215 from the test tray 180 to the magazine unloader section 243 is explained. Here, the sort carrier 241 can be moved horizontally, and moved near the test tray 180. The DUT 215 loaded on the test tray 180 is transferred to the sort carrier 241 by the suction transfer device using a vacuum pump. The sort carrier 241 moves to the magazine loader section 242, and the DUT 215 is dropped by gravity in the tilted magazine arranged inside the magazine loader section and stored in series in the magazine.

As mentioned above, the IC tests using the IC test handler can be performed automatically during high/cold temperatures by setting the magazine holding a number of ICs to the magazine loader section 242, and they are sorted based on the predetermined setting upon the completion of the tests. Hence, the IC test handler is very convenient. However, because the IC test handles are expensive, it is essential that the IC test handlers shorten the test time and improve efficiency by eliminating human intervention.

SUMMARY OF THE INVENTION

It is an object of the present invention to provide an IC transfer system that can be used in conjunction with either tray type magazines or rod-shaped magazines, and further to provide an IC handler that has the freedom of using arbitrary container configurations for the storage container regardless of the supply side container.

FIG. 1 shows a first means of resolving these issues by the present invention. In order to solve the aforementioned limitations of conventional devices, a supply tray transfer mechanism 174 and tray conversion transfer mechanism 175 are provided which transfer the user tray 170 to the tray conversion section 173 and pass the IC devices over to the test tray 180. As a second supply side, a pick carrier section 112 transfers the devices from a supply magazine transfer mechanism 154 which transfers the rod-shaped magazine to the test tray transfer section 114. The test tray transfer section 114 transfers the IC devices from the pick carrier section 112 to the tray conversion section 173, then transfers the IC devices to the test tray 180.

The pick carrier section 112 converts to a horizontal transfer means for future device transfer by providing a means of lifting the devices on the tilted E rail 155b with the suction section 112a, changing to a horizontal state and placing the devices on the P carrier 112b.

FIG. 2 illustrates the 2nd solution by the present invention. In order to solve the aforementioned limitations, a storage tray transfer mechanism 186 is provided which transfers the devices from the test tray 180 to the user tray 170. As a second storage side for the IC devices, a supply magazine storage transfer section 120 transfers the devices from the test tray 180 to the rod-shaped magazine 150.

The S carrier section 122 of the magazine storage transfer section 120 causes the devices to be moved from a horizontal position an inclined position to provide for self sliding transfer of the devices due to gravity by tilting the S carrier section 122.

FIGS. 1 and 2 together show the third means of overcoming the aforesaid limitations.

In order to resolve the above issues, a supply tray transfer mechanism 174 and tray conversion transfer mechanism 175 are used to transfer the user tray 170 to the tray conversion section 173 and pass the devices over to the test tray 180. As the second supply side of the devices, the pick carrier section 112 transfers the devices from the supply magazine transfer mechanism 154 transferring the rod-shaped magazine to the test tray transfer section 114. As the first storage side of the devices, a storage tray transfer mechanism 186 transfers the devices from the test tray 180 to the user tray 170. As the second storage side of the devices, the supply magazine storage transfer section 120 transfers the devices from the test tray 180 to the rod-shaped magazine 150.

The following advantages accrue from the implementation of the present invention.

The pick carrier section 112 has the effect of providing for sliding transfer of the devices due to gravity by tilting the magazine from the horizontal position.

The test tray transfer section 114 on the magazine side and tray conversion transfer mechanism 175 on the user tray side unify both the transfer mechanisms for future transfer by transferring and passing the devices over to the test tray 180.

The S carrier 122 on the magazine side provides for self sliding transfer by tilting the magazine from the horizontal position.

The magazine storage transfer section 120 on the magazine side and the storage tray transfer mechanism 186 on the user tray side separate and transfer from the common test trays 180 to either one of the container storage sides.

As a whole, the present invention provides an IC transfer system that can flexibly adapt supply/storage transfers with both the container configurations of the rod-shaped magazine and the tray type magazine.

A further objective of the present invention is as follows.

In the conventional measuring method, the DUT that are judged as good are shipped as they are whereas the DUT that are judged as defective the first time are all retested, (i.e. tests are generally performed for a second time). This is to detect final defects under different test items, or to judge different categories for the identical test condition. Hence, all DUT in the category judged as defective for the first time are retested at the same time.

The DUT stored in the magazine are required to be tested multiple times and it would be desirable to sort and store them in the magazine or customer tray based on the final test results. In addition, during the tests, it would be desirable not to have an inefficient method by transferring the magazine from the magazine unloader section to the magazine loader section such as through human intervention.

The objective of the present invention is to realize a device reinspection method in the IC test handler that reinspects DUT stored in the magazine without human intervention, sorts in accordance with the test results, and stores in the magazine and the customer tray.

In order to achieve the above objective, the device reinspection method of the present invention is performed as follows.

That is, when testing the DUT 215 using the IC test handler and IC tester, an inspection setting (that sets, for example, the number of reinspections, the classification of inspection results;, and the storage tray/magazine), is determined. The handler 221 starts to operate, and the DUT 215 is loaded 203 from the magazine to the test tray 180 and tested 204. After the test 204 is completed, a determination is made as to whether the IC device needs reinspection. If the IC device does not require reinspection, then the IC is sorted and stored by each category and the testing is completed 213. If the ICs do need reinspection, the DUT 215 to be reinspected are all stored 206 in the customer tray 216 of the unloader section 223 of the reinspection category and transferred 207 to the loader section 222 using the tray transfer system 227. The above handler 221 starts to operate 202 again, and the DUT 215 is loaded 203 from the customer tray 216 of the loader section 222 to the test tray 180 and tested 204 for the second time. When reinspection of the DUT is completed, the DUT 215 is sorted and stored by the category and the testing is completed 213.

At this time, sorting and storing 212 by the category are performed for three cases, i.e. for only the magazine of the magazine unloader section 243, for both the magazine of the magazine unloader section 243 and the customer tray 216 of the unloader section 223, and for only the customer tray 216 of the unloader section 223.

In the above mentioned device reinspection method, the DUT that was inspected can be reinspected as many times as needed without human intervention, and sorted and stored only in the magazine, only in the customer tray or both the magazine and customer tray in accordance with the test results.

DETAILED DESCRIPTION OF THE INVENTION

The 1st embodiment of the present invention is explained with reference to the figures.

The 1st embodiment of the present invention is an IC transfer system that provides the supply and storage structures used for both the tray type magazine and rod-shaped magazine. This is described in detail with reference to FIGS. 1 and 2.

Figure 1:
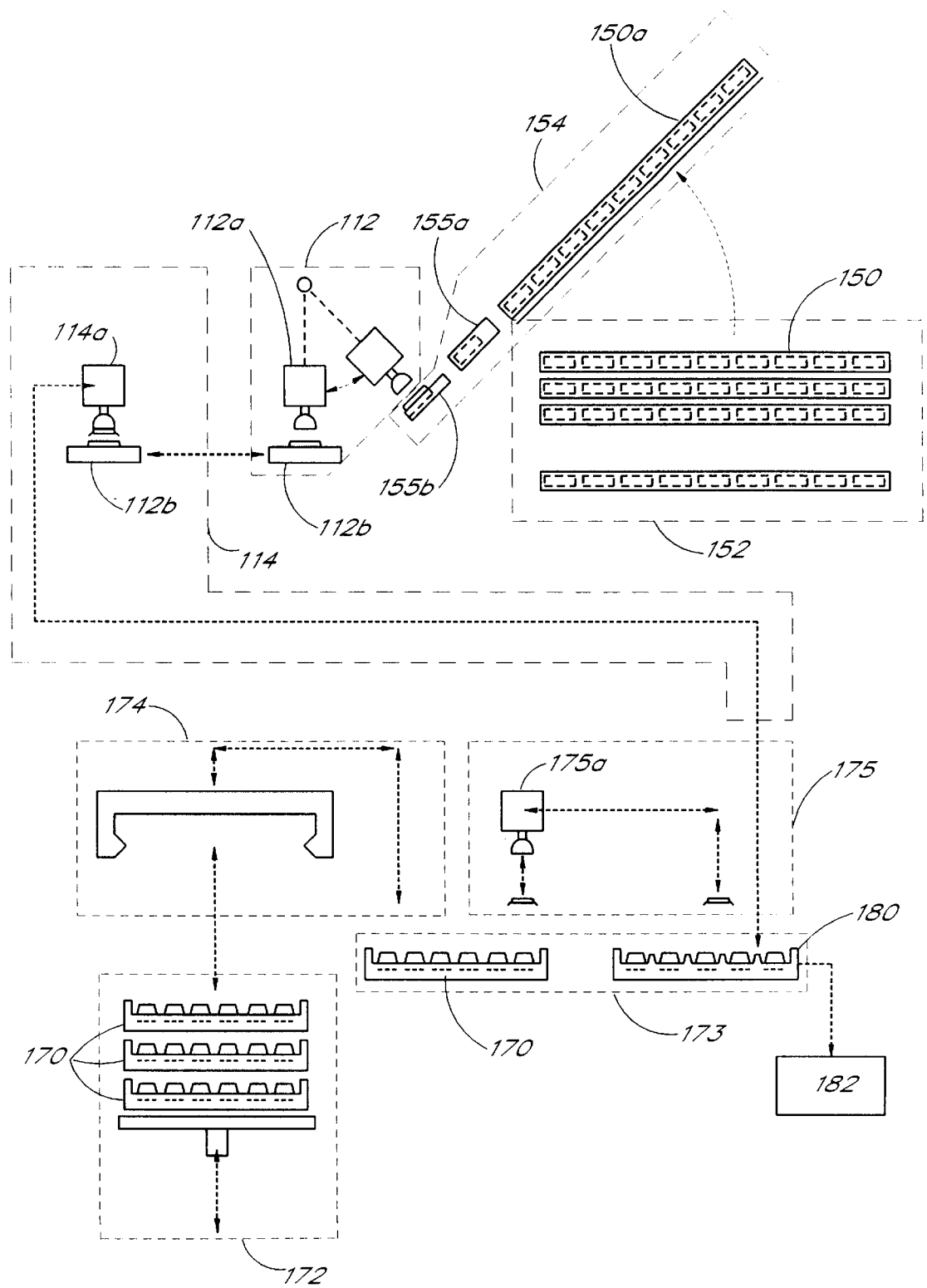
FIG. 1 is a schematic diagram of the transfer of the device supply section constructed in accordance with a first embodiment of the present invention.

First, the transfer system of the device supply side is explained. The transfer structure of the device supply side includes, as shown in FIG. 1, a tray supply section 172 which is a supply section for the tray type magazine, the supply tray transfer mechanism 174, the tray conversion section 173, the tray conversion transfer mechanism 175, the test tray 180, the test section 182, the magazine supply section 152 which is a supply section for the rod-shaped magazine, the supply magazine transfer mechanism 154, the pitch carrier section 112, and the test tray transfer section 114.

The structure of the IC transfer section of the tray magazine side is identical to that of the previous explanation.

In the structure of the transfer section of the rod-shaped magazine side, the structure of the transfer from the magazine supply section 152 to the supply magazine transfer mechanism 154 is identical to the previous explanation.

The pick carrier section 112 places the device on the P carrier 112b after setting the position of the device to horizontal by lifting the device with the suction section 112a. Afterwards, the IC device is transferred by means of sliding.

The test tray transfer section 114 laterally transfers the P carrier 112b that stores the device, under the suction section 114a. The suction section 114a lifts the device by suction from the P carrier 112b and transfers to the tray conversion section 173, and places the device on the test tray 180 and returns to its original position.

The tray conversion section 173 also transfers the IC device from the existing tray supply section 172 side and similarly places the IC device on the test tray 180. As a result, the IC device may be placed onto the tray 180 from either the magazine 150 or the user tray 170. The transfer to the test section 182 beyond the tray conversion section 173 is identical to the transfer mechanism described in the background.

Next, the transfer system of the device storage side is explained.

Figure 2:
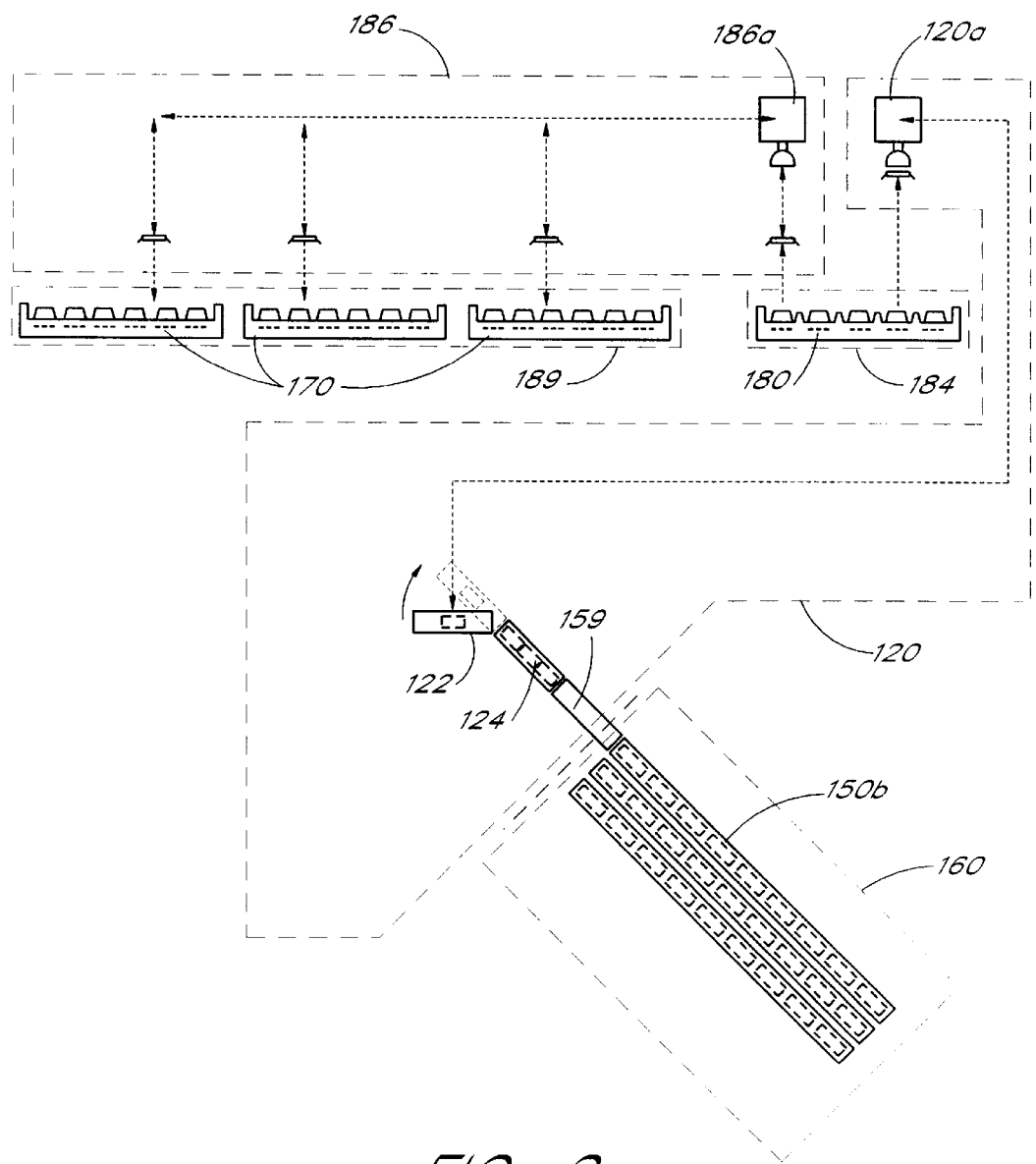
FIG. 2 is a schematic diagram of the transfer of the device storage section constructed in accordance with the first embodiment of the present invention.
Figure 3:
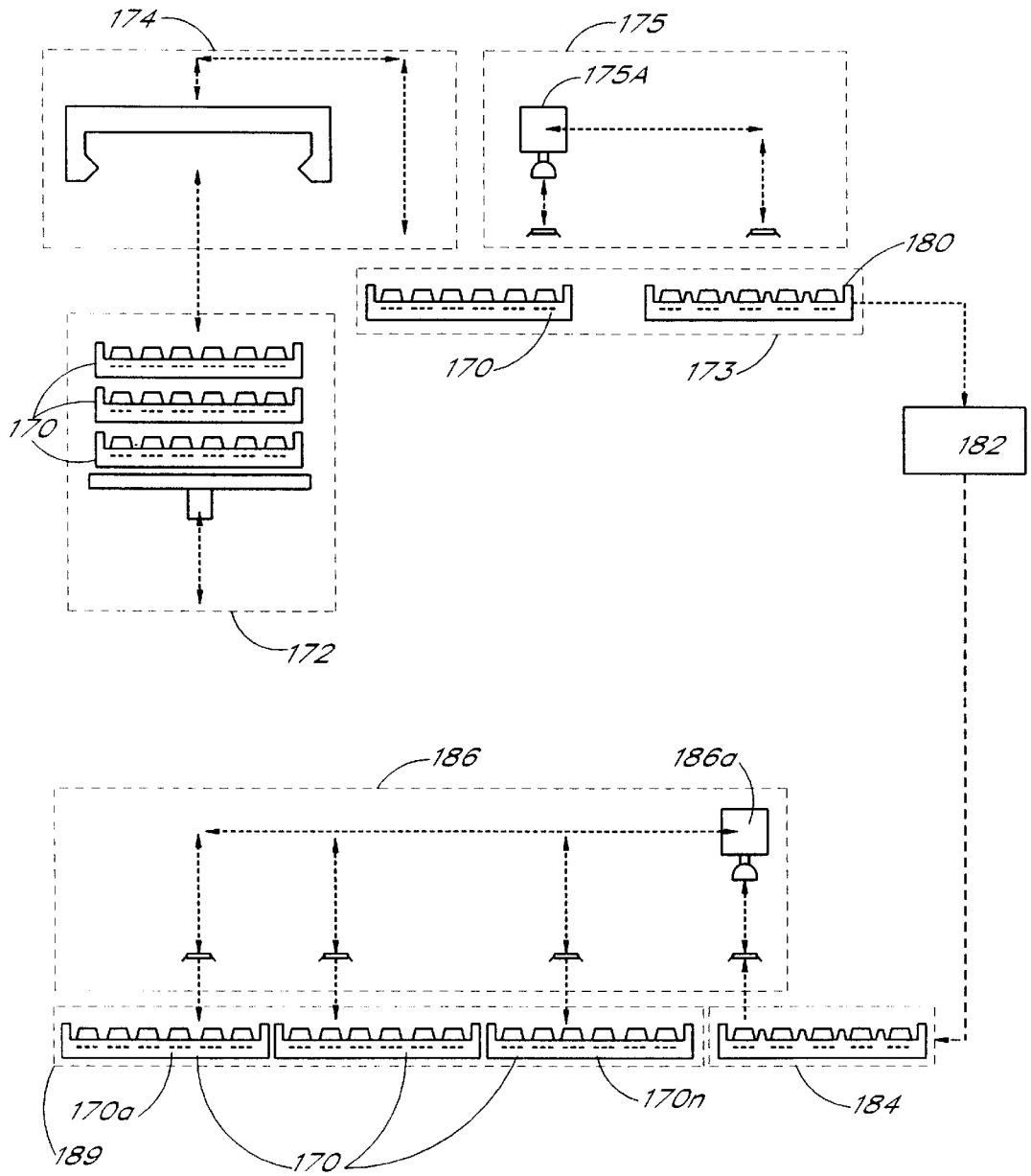
FIG. 3 is a conceptual diagram showing the construction of an IC transfer system having the existing tray type magazine.
Figure 4:
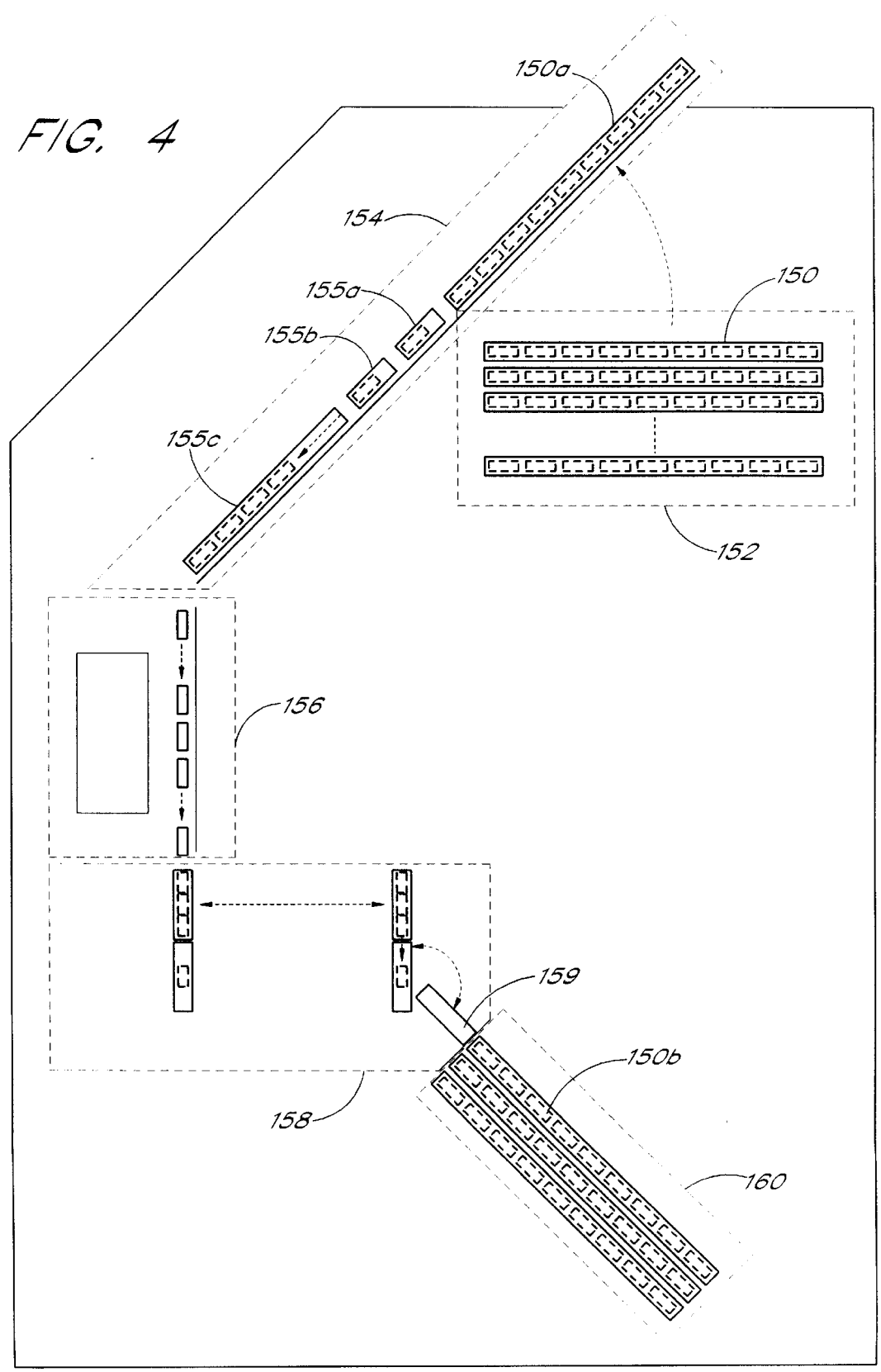
FIG. 4 is a conceptual diagram showing the construction of an IC transfer system having the existing rod-shaped type magazine.

The transfer structure of the device storage side includes, as shown in FIG. 2, a sorting buffer stand 184 which is a storage section side for the tray type magazine, a storage tray transfer mechanism 186, a tray storage section 189, a magazine storage transfer section 120 which is a storage section side for the rod-shaped magazine, and a magazine storage section 160.

The structure of the device storage side of the tray magazine side is identical to the previous explanation.

The transfer mechanism used to transfer the IC device using the rod-shaped magazine side is explained below.

The magazine storage transfer section 120 includes the suction section 120*a*, S carrier 122, S buffer 124, and sorter 159. The suction section 120*a* lifts the device on the test tray 180 (which is positioned on the sorting buffer stand 184) by suction, and transfers to the S carrier 122 and places the IC device onto the S carrier 122.

The S carrier 122 tilts the IC devices from the horizontal position to an inclined position to effect transfer of the IC device by sliding. The IC device is stored in the S buffer 124.

Rails are disposed in multiple rows in the S buffer 124 and multiple devices are stored in a single rail, where the rail functions as a temporary buffer for the device.

When any one row of the S buffer is filled with the devices, they are stored in the sorter 159 side by sliding.

The sorter 159 transfers the devices to the magazine 150*n* corresponding to the classification of the magazine storage section 160 laterally, then deposits the IC devices into the appropriate slots by sliding and returns to the position of the S buffer 124.

Sorting and storing the devices are performed by repeating the above transfer operations.

As explained above, having the transfer system on the device supply side and device storage side enables the IC handler of the present invention to flexibly adopt the magazine configurations of either the user tray 170 or magazine 150 and transfer for supply and storage.

In the above first embodiment, the case where the structure can adopt both the magazine configurations of the device supply side and device storage side, was described. However, it will be appreciated by one of ordinary skill in the art that a structure that adopts both the magazine configurations for only the device supply side or only the device storage side, can be used for the transfer system.

In addition, in the above embodiment, a system wherein one transfer system for one kind of tray/magazine containers, was described. However, it will be apparent to one skilled in the art that the structure of the supply/storage can be arranged with multiple systems that can adopt tray and magazine containers in different sizes and can be similarly implemented.

Furthermore, the suction section 120*a* located at the magazine storage transfer section 120 was described to have a newly arranged structure. However, the suction section 120*a* can be structured such that it shares the suction section 186*a* of the storage tray transfer mechanism 186, and is similarly implemented.

The following advantages accrue because of the structure of the IC handler described in the first embodiment of the present invention.

As shown in FIG. 1, the IC devices can be changed from a horizontal position to an inclined position to provide for transfer of the IC devices by sliding. The IC device can be lifted by suction at the pick carrier section 112 and placed on the P carrier 112*b*.

As shown in FIG. 1, by transferring the devices from the magazine 150 to the test tray 180 in the test tray transfer section 114 while transferring the devices from the user tray 170 to the test tray 180 using the tray conversion transfer mechanism 175, future device transfers can be made by utilizing the common transfer mechanism.

As shown in FIG. 2, by inclining the devices placed on the S carrier 122 from the horizontal position to the self sliding transfer position, the IC devices are transferred by self sliding using gravity.

As shown in FIG. 2, the IC handler can flexibly adopt either magazine configurations and store the devices by storing the devices on the sorting buffer stand 184 in the magazine storage section 160 at the magazine storage transfer section 120 or in the user tray 170 at the storage tray transfer mechanism 186.

As a result, an IC transfer system can be used in conjunction with both container configurations of the rod-shaped magazine and the tray type magazine. Furthermore, the IC handler that has the freedom of using arbitrary container configurations for the storage container regardless of the supply side container. Hence, the present invention provides a general purpose IC transfer system that can adopt transportation/distribution configurations of the device.

The second embodiment of the present invention is explained with reference to FIG. 5.

Figure 5:
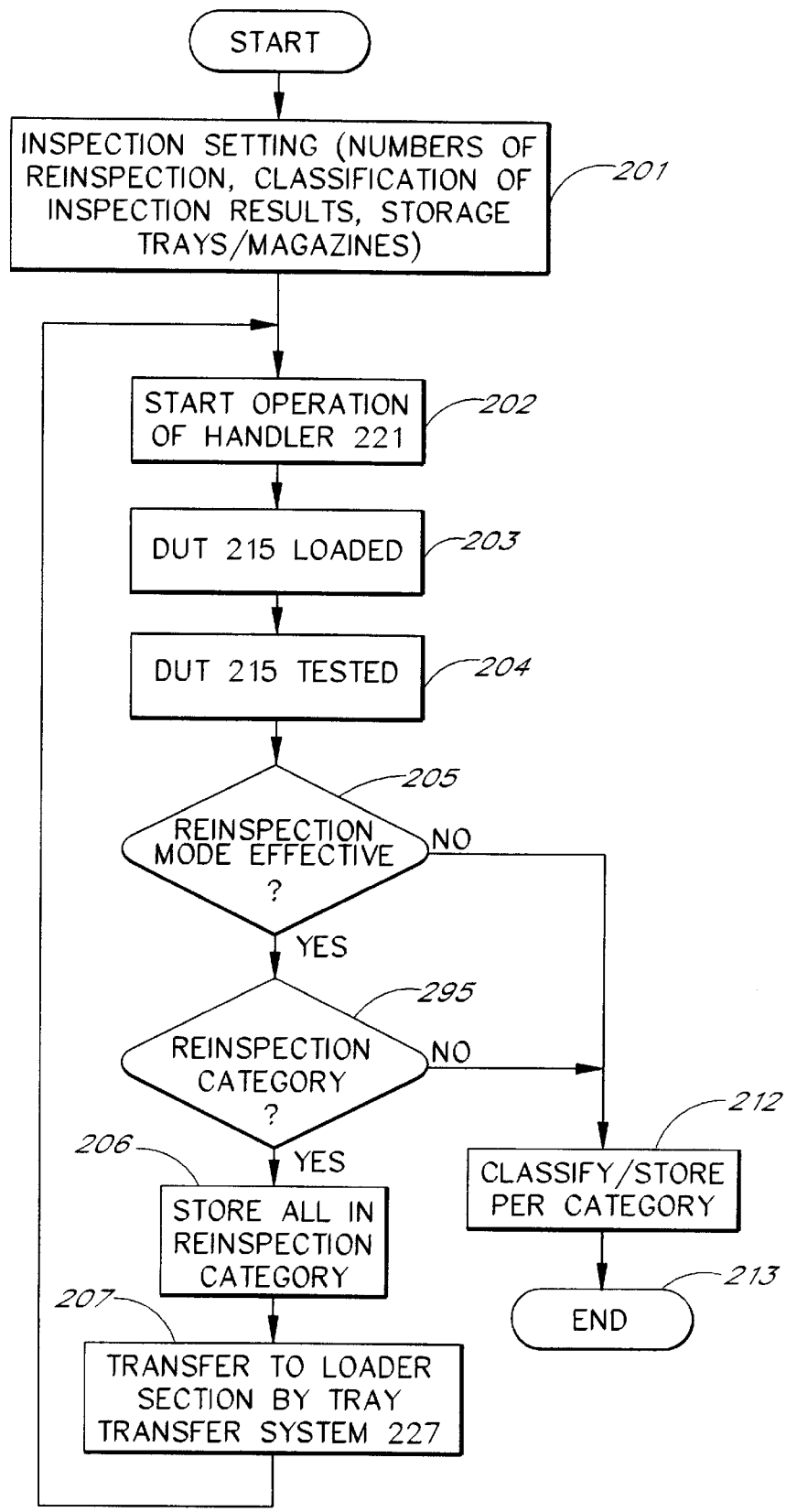
FIG. 5 is a flowchart of illustrating the method of a second embodiment of the present invention.
Figure 6:
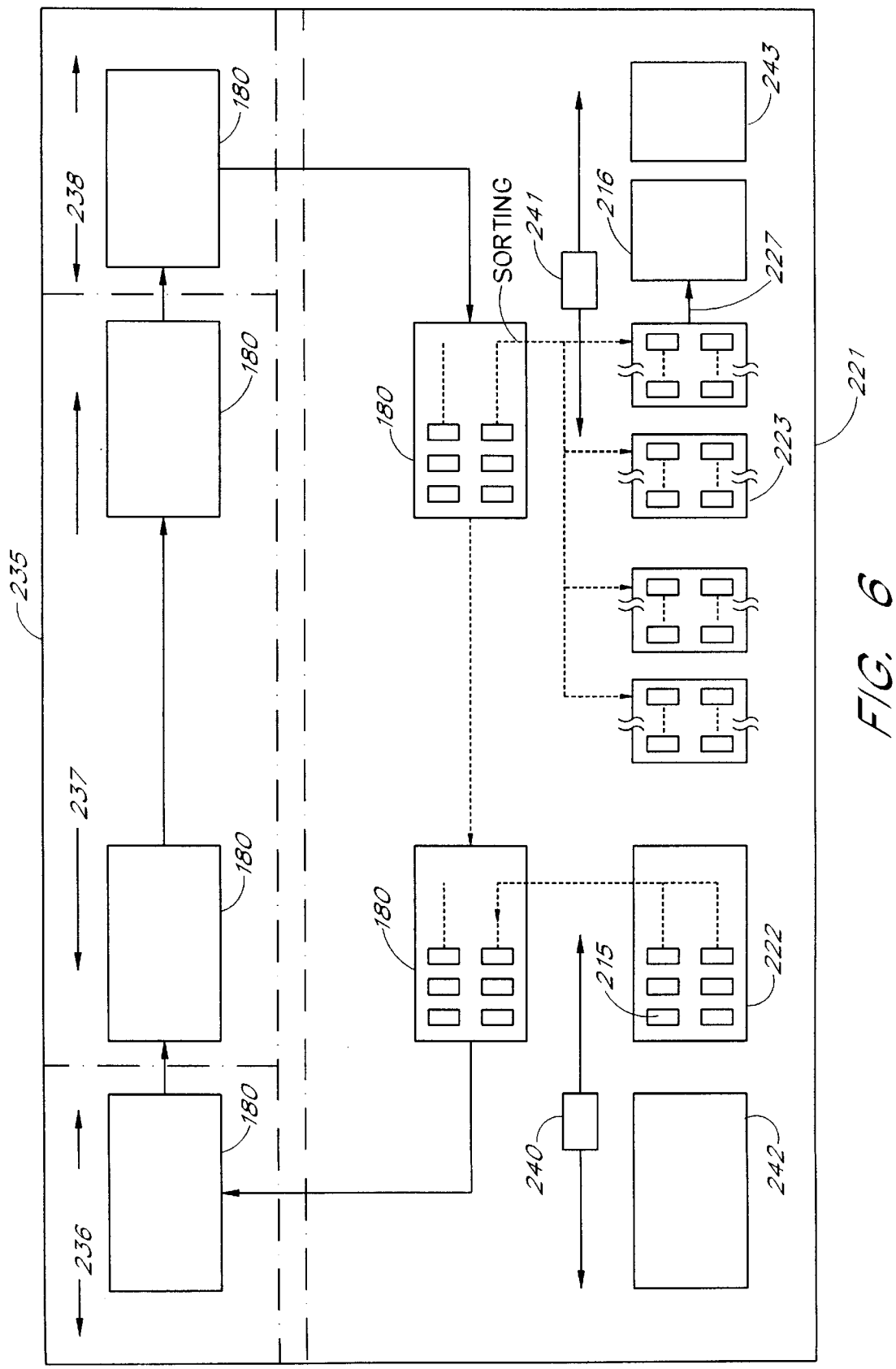
FIG. 6 is a top view of the handler implementing the 2nd embodiment of the present invention.
Figure 7:
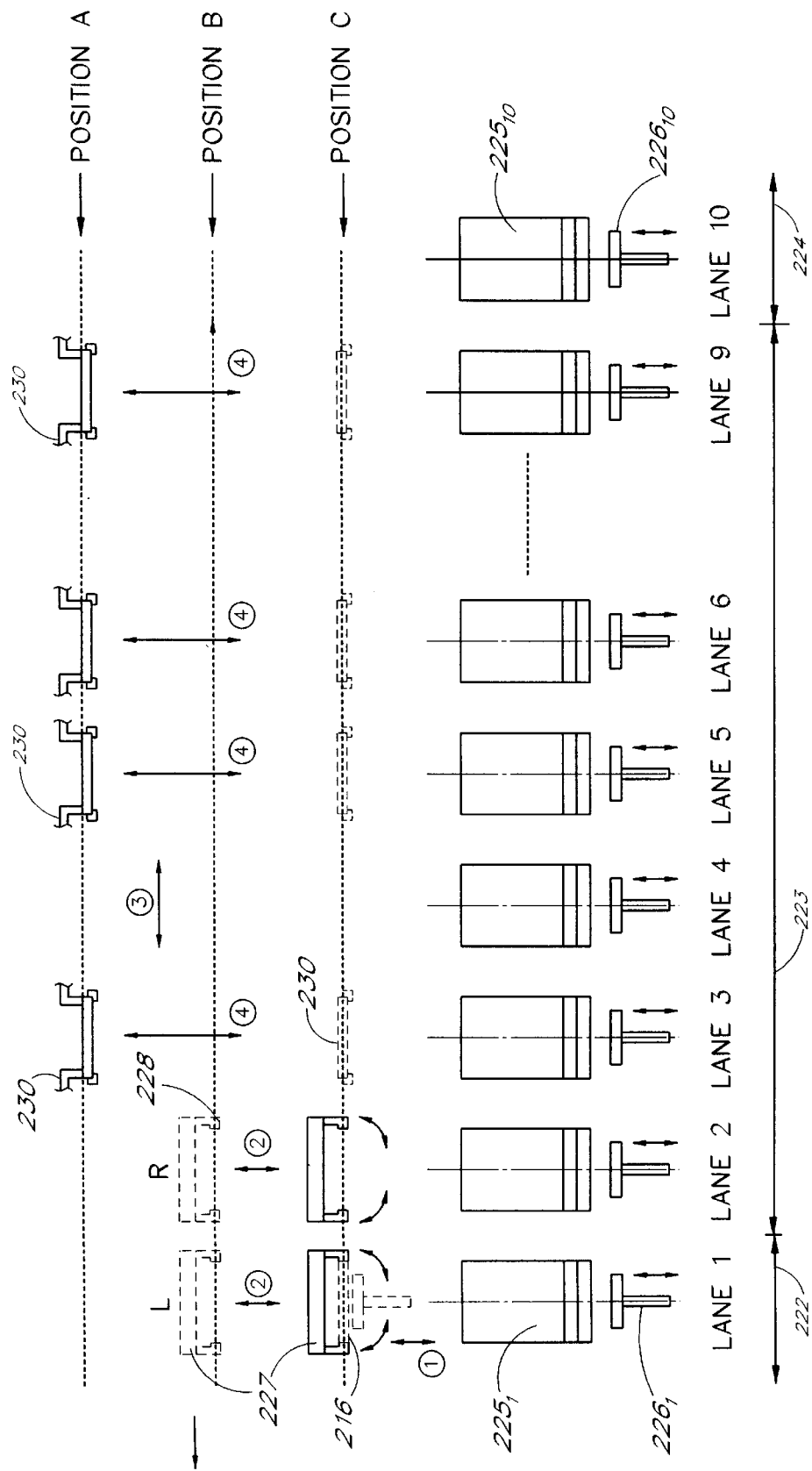
FIG. 7 is an illustration explaining the operation of the handler implementing the 2nd embodiment of the present invention.
Figure 8:
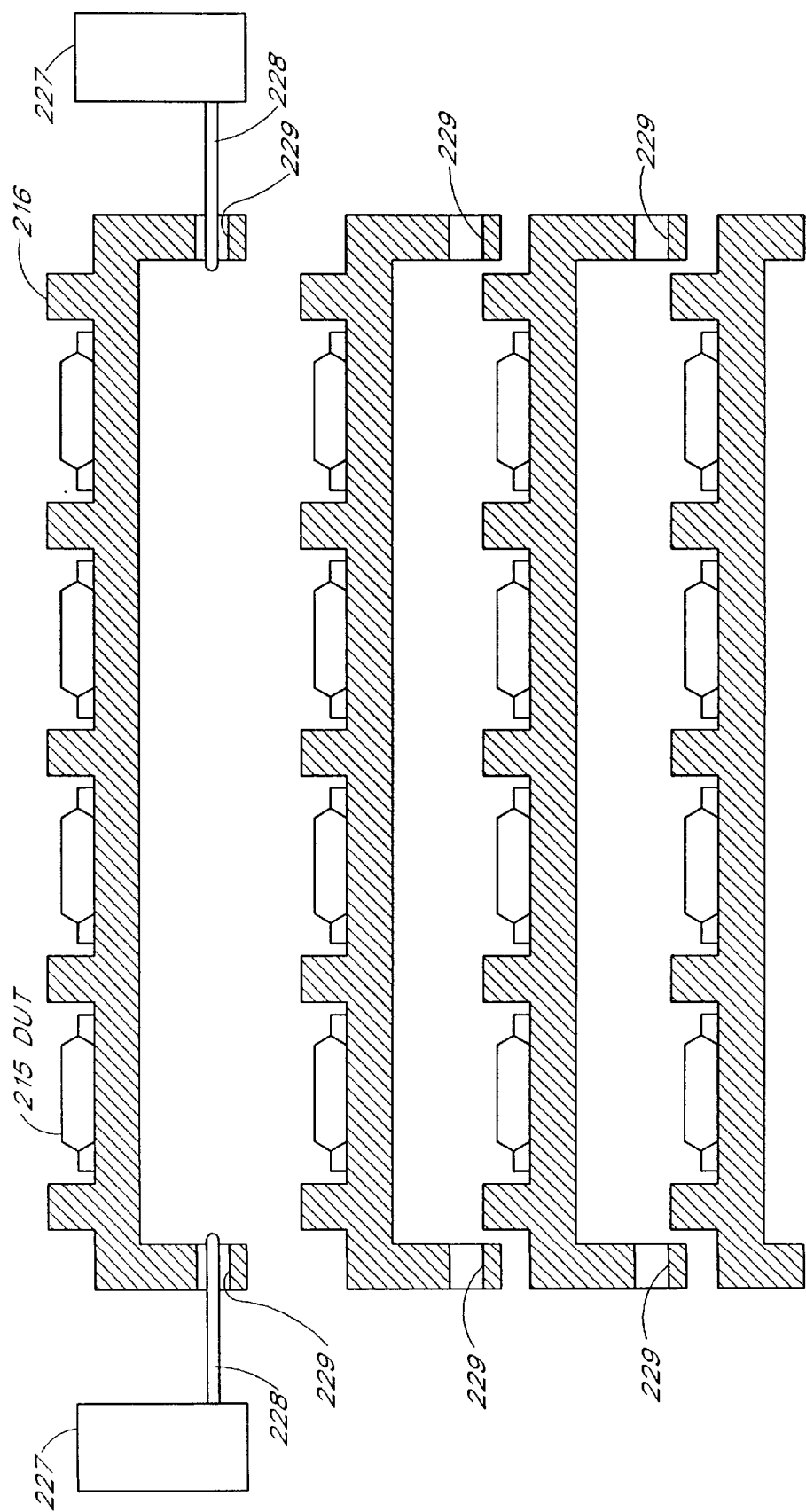
FIG. 8 is an illustration explaining the separation and transfer of only the top tray using the tray transfer system.

FIG. 5 shows a flowchart of the second embodiment of the present invention. In FIG. 5, the inspection setting 201 is determined, (i.e., the number of reinspections, the classification of inspection results, and the storage trays/magazine are set). When the inspection setting is completed, the handler 221 begins operation as represented by the block 202. The DUT 215 stored in the magazine is loaded 203 to the test tray 180 through the precision carrier 240, and is tested (represented within the block 204) in the test area 237 of the temperature chamber 235 and sent to the unloader section. At this juncture, a judgement is made within a decision block 205 whether the IC device should be reinspected. If the device has been reinspected for the maximum number of times, then the IC device is not reinspected. Hence, the IC device is sorted and stored by each category and the process is completed 213.

If the IC device needs to be reinspected, then the DUT 215 which need to be reinspected are all stored (as represented in the block 206) in the customer tray 216 of the unloader section 223 for reinspection. Subsequently, they are transferred to the loader section 222 for reinspection using the tray transfer system 227.

When the preparation of the reinspection is complete, the handler 221 begins operation again (as represented by the activity block 202), and the DUT 215 placed on the customer tray 216 of the loader section 222 are loaded (as represented by the block 203) to the test tray 180 and tested (as represented by the block 204) for the second time. Until the reinspection mode is completed, the above operation repeats.

The DUT 215 that were inspected are sorted by the designated categories and stored in the classified magazines. It should be noted that both the customer tray 216 and magazine can be used at the same time for sorting and storing the DUT 215. Hence, the devices loaded from the magazine can be stored in the tray. That is, the DUT that were inspected for the first time can be reinspected as many times as needed without human intervention by passing the DUT over to the test tray 180 and customer tray 216, and they can be sorted in accordance with the test results, and stored in only the magazine, only the customer tray or both the magazine and customer tray.

We claim:

1. A device reinspection method for use in an IC test handler, comprising the steps of:

setting inspection parameters by specifying a number of reinspection, a classification of inspection results, and storage trays/magazines;

starting to operate said IC test handler (221), loading IC devices to be tested (215) from a rod-shaped magazine or a customer tray to a test tray (180), and testing said IC devices;

sorting and storing said IC devices that have been tested per each category and finalizing the test when a reinspection mode is not effective;

when the reinspection mode is effective, storing all of said IC devices (215) to be reinspected in a customer tray (216) provided at an unloader section (223), transferring said customer tray having said IC devices to be reinspected to a loader section (222) using a tray transfer system (227); and starting to operate (202) said IC test handler again (221), loading said IC devices (215) to be reinspected from said customer tray (216) of said loader section (222) to said test tray (180), performing a second test (204), and completing the test for said IC devices (215) by sorting and storing per category.

2. The device reinspection method in the IC test handler of claim 1, wherein said steps of sorting and storing per category are performed only for a magazine provided at a magazine unloader section (243).

3. The device reinspection method in the IC test handler of claim 1, wherein said steps of sorting and storing per category are performed for both of a magazine of a magazine unloader section (243) and a customer tray (216) of the unloader section (223).

4. The device reinspection method in the IC test handler of claim 1, wherein said steps of sorting and storing (212) per category are performed only for the customer tray (216) of the unloader section (223).

5. A device transfer method to be used in an IC handler for transferring IC devices to be tested from a device loading area to a test area of said IC handler through a test tray (180), comprising the following steps of:

installing a plurality of user trays (170) in a tray supply section (172) provided at said device loading area, each of said user trays (170) carrying IC devices to be tested on a horizontal plane;

replacing said user trays (170) with test trays (180) by a tray conversion section (173), said test trays (180) being circulated within said IC handler by predetermined movements in a horizontal direction;

transferring said user trays from said tray supply section (172) to said tray conversion section (173) so that said IC devices in said user trays (170) are picked therefrom and placed on said test trays (180);

providing rod-shaped magazines (150) having IC devices to be tested to a supply magazine transfer mechanism (154) in a manner for allowing a downward movement of said IC devices by means of own gravities in said rod-shaped magazines (150);

receiving said IC devices from said supply magazine transfer mechanism (154) during said downward movement and converting an angle of movement of said IC devices from said downward movement to a horizontal movement and placing said IC devices on carriers (112b) which are aligned in a horizontal direction; and transferring said IC devices on said carrier to said tray conversion section (173) and placing said IC devices on said test trays (180).

6. A device transfer method to be used in an IC handler for transferring IC devices that have been tested from a test area to a storage area of said IC handler, comprising the following steps of:

receiving a plurality of test trays (180) transferred from said test area of said IC handler, each of said test trays (170) having IC devices that have been tested on a horizonal plane;

transferring said IC devices on said test tray (180) to a user tray (170) based on test results;

providing a plurality of rod-shaped magazines (150), said rod-shaped magazines (150) being aligned at least partially in a vertical direction to allow a downward movement of IC devices in said magazines by self-gravities; and transferring the IC devices on said test tray (180) to said rod-shaped magazine (150) based on said test results by a magazine storage transfer section (120), said magazine storage transfer section (120) including a carrier (122) for receiving each of said IC devices on a plane seat and rotating said horizontal plane seat so that said IC device sliding in said magazine by said downward movement caused by said gravity.

* * * * *